US007713776B1

(12) United States Patent
Horng et al.

(10) Patent No.: US 7,713,776 B1
(45) Date of Patent: May 11, 2010

(54) METHOD OF MAKING A LIGHT EMITTING DIODE

(75) Inventors: Ray-Hua Horng, No. 250, Kuo-Kuang Road, South District, Taichung City (TW); Dong-Sing Wuu, Taichung (TW)

(73) Assignee: Ray-Hua Horng, Taichung (TW)

( * ) Notice: Subject to any disclaimer, the term of this patent is extended or adjusted under 35 U.S.C. 154(b) by 0 days.

(21) Appl. No.: 12/540,621

(22) Filed: Aug. 13, 2009

(51) Int. Cl.
H01L 21/00 (2006.01)
H01L 21/40 (2006.01)
(52) U.S. Cl. .............. 438/69; 438/72; 438/82; 438/99; 257/E21.259; 257/E21.514; 257/E21.527; 257/E21.53
(58) Field of Classification Search .......... 257/E21.259, 257/E21.514, E21.527, E21.53
See application file for complete search history.

(56) References Cited

U.S. PATENT DOCUMENTS 6,869,820 B2 * 3/2005 Chen ........................... 438/79
2006/0284195 A1 * 12/2006 Nagai .......................... 257/98

* cited by examiner

Primary Examiner—Charles D Garber
Assistant Examiner—Mohsen Ahmadi
(74) Attorney, Agent, or Firm—Rajesh Vallabh; Foley Hoag LLP

(57) ABSTRACT

A method of making a light emitting diode includes forming a plurality of electrically conductive members at intervals on a first surface of an epitaxial layer which generates light so that the electrically conductive members are in ohmic contact with the epitaxial layer, forming a light incident layer on the first surface at regions where none of the electrically conductive members are formed, forming a light reflecting layer on the light incident layer and the electrically conductive members, providing an adhesive on the light reflecting layer, and bonding a permanent substrate to the light reflecting layer through the adhesive and through a wafer bonding process.

10 Claims, 10 Drawing Sheets

METHOD OF MAKING A LIGHT EMITTING DIODE

BACKGROUND OF THE INVENTION

1. Field of the Invention

This invention relates to a method of making a solid-state light emitting device, more particularly to a method of making a light emitting diode.

2. Description of the Related Art

Referring to FIG. 1, a conventional vertically structured light emitting diode (LED) 1 includes an epitaxial layer 11 that generates light when electricity is supplied, a reflective layer 12 that is formed on a bottom surface 116 of the epitaxial layer 11 to reflect light, an electrode 13 that is disposed on a top surface 115 of the epitaxial layer 11, and a substrate 14 that is connected to the reflective layer 12.

The epitaxial layer 11 is formed by epitaxying a gallium nitride series semiconductor material on an epitaxial substrate (not shown), and includes p-type and n-type cladding layers 111,112 that are formed via doping, and an active layer 113 that is formed between the p-type and n-type cladding layers 111,112. A band gap exists between the p-type and n-type cladding layers 111,112. When electricity is supplied to the epitaxial layer 11, recombination of electron-hole pairs occurs in the active layer 113, thereby releasing energy in a form of light. The top surface 115 of the epitaxial layer 11 is roughened so as to prevent full reflection of the light produced from the epitaxial layer 11. As a result, the light can be directly emitted out of the LED 1 to the utmost through the top surface 115, thereby enhancing light emitting efficiency of the LED 1.

The reflective layer 12 is made of a material that has high reflectivity. Generally, the reflective layer 12 is made of a metal that has high reflection coefficient and is disposed in ohmic contact with the epitaxial layer 11 for electrical conduction. When the light generated from the epitaxial layer 11 is transmitted to the bottom surface 116, the reflective layer 12 is capable of reflecting the light back to the top surface 115, thereby emitting the light out of the LED 1 and improving the light emitting efficiency of the same.

The substrate 14 is made of a thermally and electrically conductive material that is normally an alloy or a metal, is able to support the reflective layer 12 and the epitaxial layer 11, and serves as another electrode relative to the electrode 13. Furthermore, when the electricity is supplied to the epitaxial layer 11, the substrate 14 is capable of dissipating waste heat that is generated by the epitaxial layer 11 and that is subsequently transferred to the reflective layer 12. Therefore, the epitaxial layer 11 in use is maintained at a temperature that is unable to influence radiative recombination efficiency.

When the electricity is supplied to the epitaxial layer 11 by virtue of the electrode 13 and the substrate 14, current passes through the p-type and n-type cladding layers 111,112, and the active layer 113. Consequently, the light is generated due to the recombination of the electron-hole pairs. One portion of the light is directly transmitted to the top surface 115 and is able to pass through the top surface 115 with a higher chance due to roughness of the same. Another portion of the light is transmitted to the bottom surface 116, is reflected to the top surface 115 via the reflective layer 12, and can pass through the top surface 115 with a greater possibility on account of the roughness of the same as well.

During production of the LED 1, the reflective layer 12 is coated on the bottom surface 116 of the epitaxial layer 11 that is still connected to the epitaxial substrate (not shown), and is bonded to the epitaxial layer 11 by virtue of a wafer bonding process. The substrate 14 is bonded to the reflective layer 12 through wafer bonding as well. Afterward, the epitaxial substrate (not shown) is removed from the n-type cladding layer 112 so as to expose and roughen the top surface 115 of the epitaxial layer 11.

However, bonding between the epitaxial layer 11 and the reflective layer 12, and between the reflective layer 12 and the substrate 14 is not strong enough since only wafer bonding is conducted, thereby lowering a production yield of the LED 1. Furthermore, the reflective layer 12 is bonded to the epitaxial layer 11 and is disposed in ohmic contact with the same through the wafer bonding process performed at a temperature that ranges from 200° C. to 400° C. Thus, quality of the reflective layer 12 may be degraded on account of the high temperature (200° C. to 400° C.) such that reflectivity of the reflective layer 12 may be influenced. The light emitting efficiency of the LED 1 may be further lowered.

For increasing the production yield of the LED 1, the bottom surface 116 of the epitaxial layer 11 is required to be sufficiently flat so as to be tightly bonded to the reflective layer 12. Consequently, only one surface (i.e., the top surface 115) of the epitaxial layer 11 is roughened. External quantum efficiency of the LED 1 needs to be improved further.

SUMMARY OF THE INVENTION

The object of the present invention is to provide a method of making a light emitting diode for overcoming the aforesaid drawbacks of the prior art.

According to this invention, a method of making a light emitting diode comprises the steps of: (a) forming a plurality of electrically conductive members at intervals on a first surface of an epitaxial layer which generates light so that the electrically conductive members are in ohmic contact with the epitaxial layer; (b) forming a light incident layer on the first surface at regions where none of the electrically conductive members are formed; (c) forming a light reflecting layer on the light incident layer and the electrically conductive members; (d) providing a permanent substrate; (e) providing an adhesive; and (f) disposing the permanent substrate on the light reflecting layer, and bonding the permanent substrate to the light reflecting layer.

The light incident layer is higher than the electrically conductive members. The light reflecting layer has indented parts where the light reflecting layer overlies the electrically conductive members, and non-indented parts where the light reflecting layer overlies the light incident layer. The adhesive is provided in the indented parts of the light reflecting layer. The permanent substrate is bonded to the indented parts through the adhesive and to the non-indented parts through wafer-bonding.

BRIEF DESCRIPTION OF THE DRAWINGS

Other features and advantages of the present invention will become apparent in the following detailed description of the preferred embodiments of this invention, with reference to the accompanying drawings, in which.

DETAILED DESCRIPTION OF THE PREFERRED EMBODIMENTS

Figure 1:
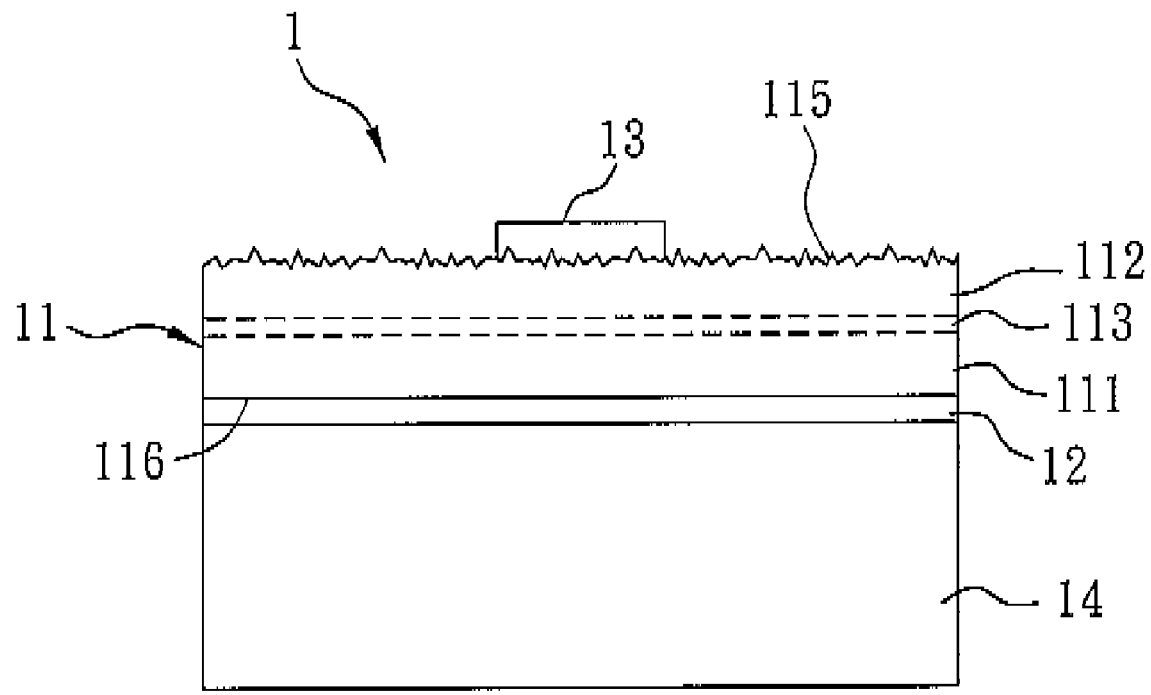
FIG. 1 is a schematic view of a conventional vertically structured light emitting diode.

Before the present invention is described in greater detail, it should be noted that the same reference numerals have been used to denote like elements throughout the specification.

Figure 2:
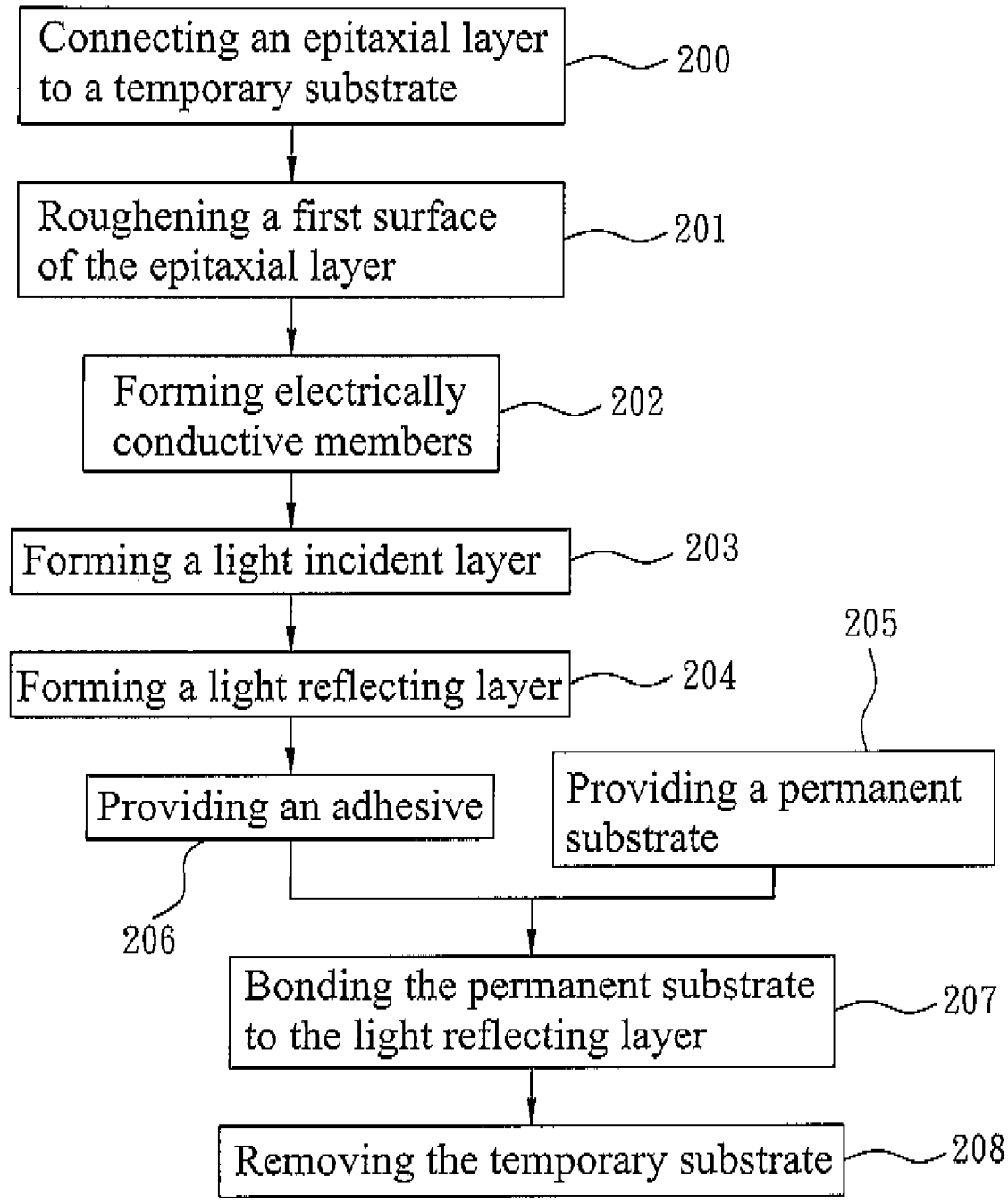
FIG. 2 is a flow chart of the first preferred embodiment of a method of making a light emitting diode according to this invention.

Referring to FIG. 2, according to the present invention, the first preferred embodiment of a method of making a light emitting diode includes steps 201 to 208.

Figure 3:
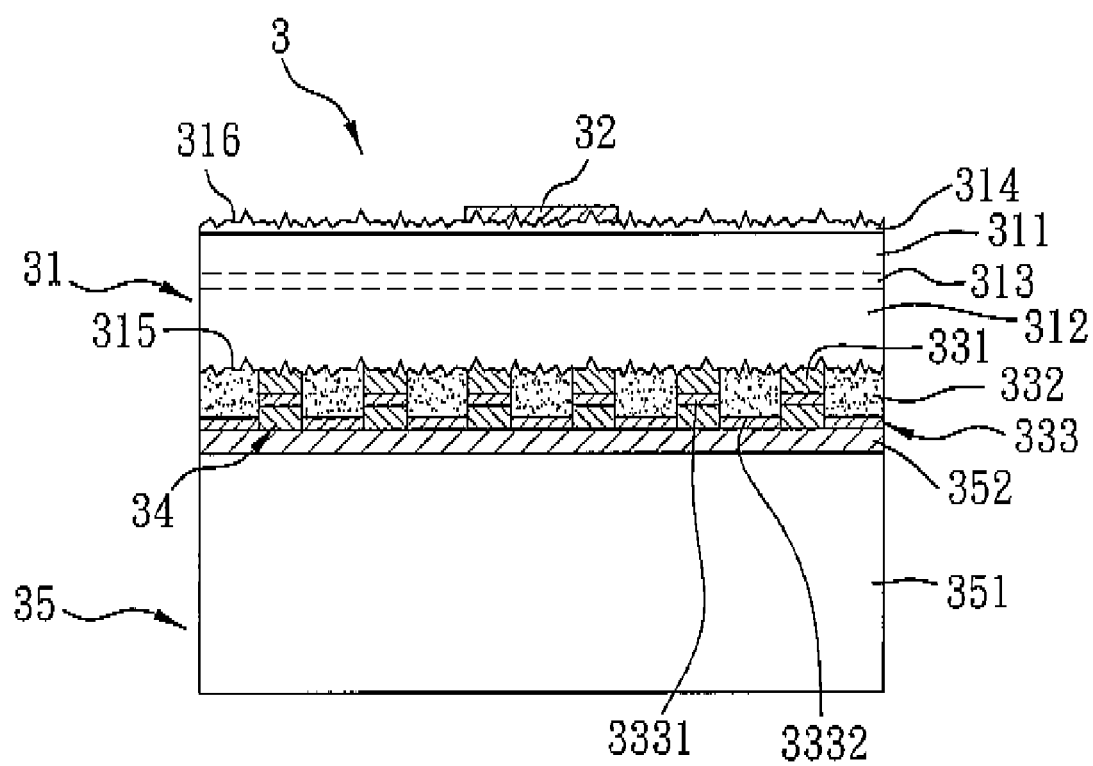
FIG. 3 is a schematic partly sectional view to illustrate the light emitting diode made according to the method of the first preferred embodiment.

Referring to FIG. 3, the first preferred embodiment of the method is conducted to produce a light emitting diode (LED) 3 that has a vertical structure and that includes an epitaxial layer 31, an electrode 32, a plurality of electrically conductive members 331, a light incident layer 332, a light reflecting layer 333, an adhesive 34, and an electrically conductive permanent substrate 35.

The epitaxial layer 31 generates light when electricity is supplied, is made from a gallium nitride series semiconductor material, has a first surface 315 and a second surface 316 that is opposite to the first surface 315, and includes a first cladding layer 311 that has the second surface 316, a second cladding layer 312 that has the first surface 315, an active layer 313 that is formed between the first and second cladding layers 311,312, and a current diffusion layer 314 that is made of a transparent and electrically conductive material and that is formed on the first cladding layer 311. The electrode 32 is disposed on the second surface 316 of the epitaxial layer 31 and in ohmic contact with the epitaxial layer 31.

The first and second cladding layers 311,312 are formed through doping. A band gap exists between the first and second cladding layers 311,312. When the electricity is supplied to the epitaxial layer 31, recombination of electron-hole pairs occurs in the active layer 313, thereby releasing energy in a form of light. The current diffusion layer 314 is able to uniformly and transversely diffuse current so as to enhance internal quantum efficiency. The first and second surfaces 315,316 of the epitaxial layer 31 are roughened such that reflection of the light generated by the epitaxial layer 31 is prevented. Accordingly, possibility that the light can pass through the first and second surfaces 315,316 is enhanced.

The electrically conductive members 331 are formed on the first surface 315 of the epitaxial layer 31 in ohmic contact with the epitaxial layer 31, are spaced apart from each other, and are substantially equal in height.

The light incident layer 332 is formed on the first surface 315 of the epitaxial layer 31 at regions where none of the electrically conductive members 331 are formed, and has a refractive index lower than a refractive index of the epitaxial layer 31, and a height larger than a height of each of the electrically conductive members 331. The light incident layer 332 can be made from silicon oxide.

The light reflecting layer 333 is made of a highly reflective and electrically conductive material such as aluminum, and is formed on the light incident layer 332 and the electrically conductive members 331. The light reflecting layer 333 has a uniform thickness and includes indented parts 3331 where the light reflecting layer 333 overlies the electrically conductive members 331, and non-indented parts 3332 where the light reflecting layer 333 overlies the light incident layer 332. Preferably, the light reflecting layer 333 is a layer of a metal or an alloy in order to have higher reflectivity and to facilitate electrical connection with the permanent substrate 35 through direct contact with the permanent substrate 35.

The adhesive 34 is disposed in the indented parts 3331 of the light reflecting layer 333, is in liquid form at a temperature of a wafer bonding process, and has a bottom side that is flush with a bottom side of the non-indented parts 3332 of the light reflecting layer 333, and that cooperates with the same to define a plane. The adhesive 34 may be made from a highly transparent heat-curable silicone die-bond material. The adhesive 34 in this embodiment is a product (Model No. KER-3000-M2) of Shin-Etsu Silicone Taiwan Co., Ltd.

The permanent substrate 35 is formed on the light reflecting layer 333 and the adhesive 34, is bonded to the light reflecting layer 333 through the adhesive 34 and through wafer bonding, and includes a base layer 351 that is made from a thermally conductive material, and a top layer 352 that is formed on the base layer 351, that is bonded to the light reflecting layer 333 and the adhesive 34, and that is made from an electrically conductive material so as to serve as a second electrode relative to the electrode 32. Specifically, the top layer 352 is bonded to the non-indented parts 3332 of the reflecting layer 333 by dint of wafer bonding and to the indented parts 3331 through adhesion of the adhesive 34. Preferably, the base layer 351 is made from a material that is both electrically and thermally conductive. In this embodiment, the top layer 352 is made from a gold/tin alloy.

When electricity is supplied to the LED 3 through the electrode 32 and the permanent substrate 35, current passes through the current diffusion layer 319 and is evenly spread. Afterward, the current flows through the first and second cladding layers 311,312, and the active layer 313. Light is generated due to the recombination of the electron-hole pairs. A first portion of the light is directly transmitted towards the second surface 316 and is able to pass through the second surface 316 with a great possibility due to roughness of the same. A second portion of the light is transmitted towards the first surface 315. One part of the second portion of the light is reflected from the electrically conductive members 331, and moves towards and passes through the second surface 316. Another part of the second portion of the light enters the light incident layer 332 whose refractive index is lower than that of the epitaxial layer 31, is reflected from the light reflecting layer 333 to the first surface 315, enters the epitaxial layer 31 with a great chance due to roughness of the first surface 315, and is able to pass through the second surface 316 with a large possibility on account of the roughness of the same. Therefore, the light emitting efficiency of the LED 3 is enhanced.

Figure 4:
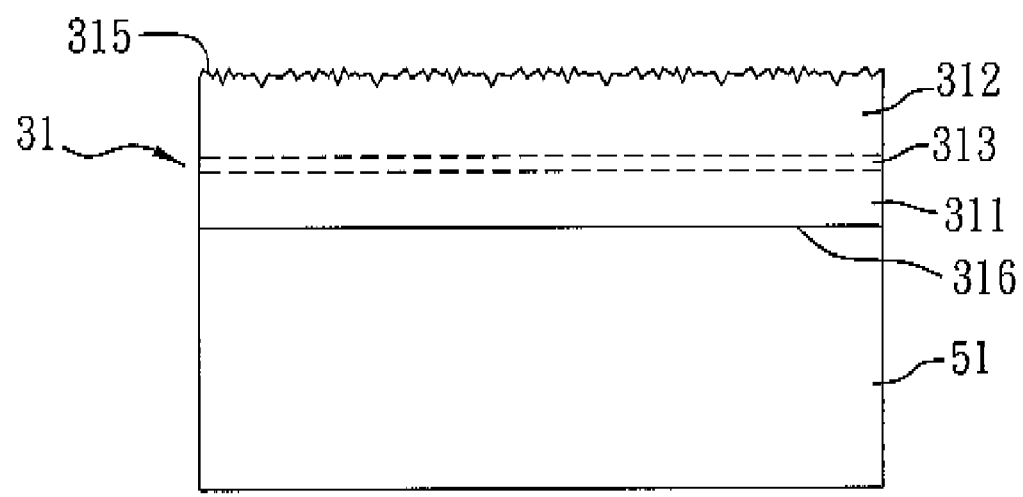
FIG. 4 is a schematic view to illustrate a first surface of an epitaxial layer, which is roughened according to the method of the first preferred embodiment.

The method of the first preferred embodiment is described as follows. Referring to FIGS. 2 and 4, in step 200, the epitaxial layer 31 is connected to a temporary substrate 51 so that the temporary substrate 51 is bonded to the second surface 316 of the epitaxial layer 31 opposite to the first surface 315. Subsequently, the first surface 315 of the epitaxial layer 31 is roughened in step 201.

Figure 5:
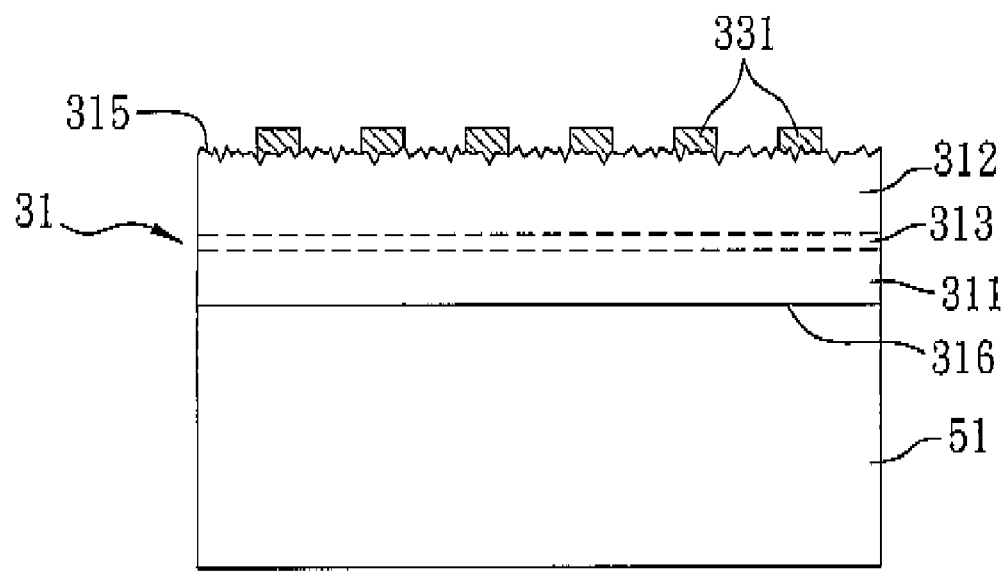
FIG. 5 is a schematic partly sectional view to illustrate electrically conductive members that are formed on the roughened first surface according to the method of the first preferred embodiment.

Referring to FIGS. 2 and 5, in step 202, the electrically conductive members 331 are formed at intervals on the roughened first surface 315 of the epitaxial layer 31 so that the electrically conductive members 331 are in ohmic contact with the epitaxial layer 31. In this embodiment, the electrically conductive members 331 are made of a titanium/aluminum alloy.

Figure 6:
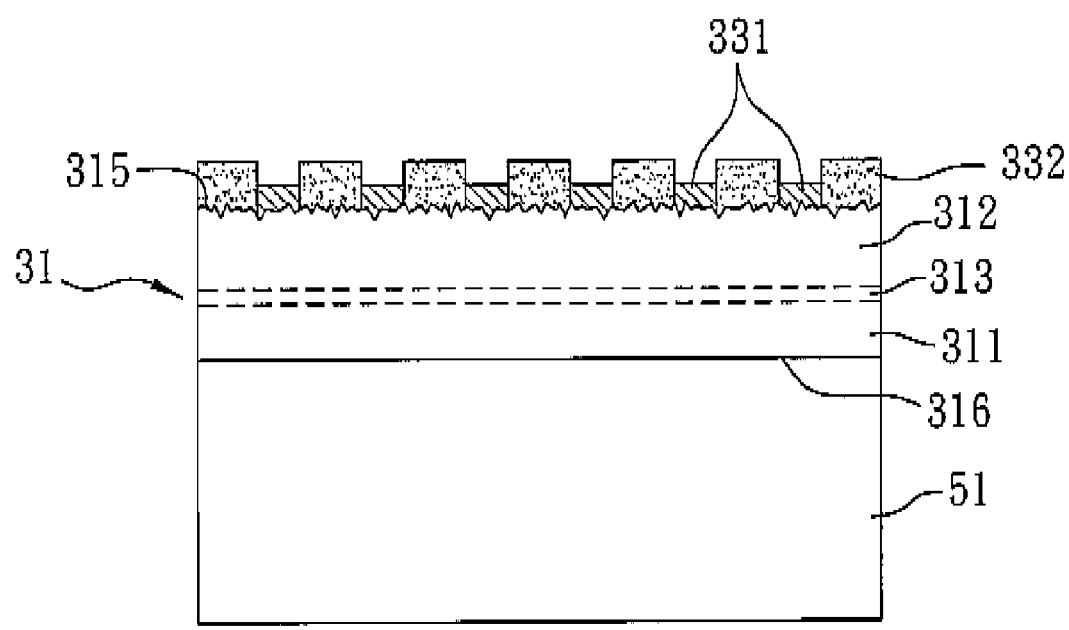
FIG. 6 is a schematic partly sectional view to illustrate a light incident layer that is formed on the roughened first surface according to the method of the first preferred embodiment.

Referring to FIGS. 2 and 6, in step 203, the light incident layer 332 is formed on the roughened first surface 315 at regions where none of the electrically conductive members 331 are formed. In this embodiment, the light incident layer 332 is made from silicon oxide.

Figure 7:
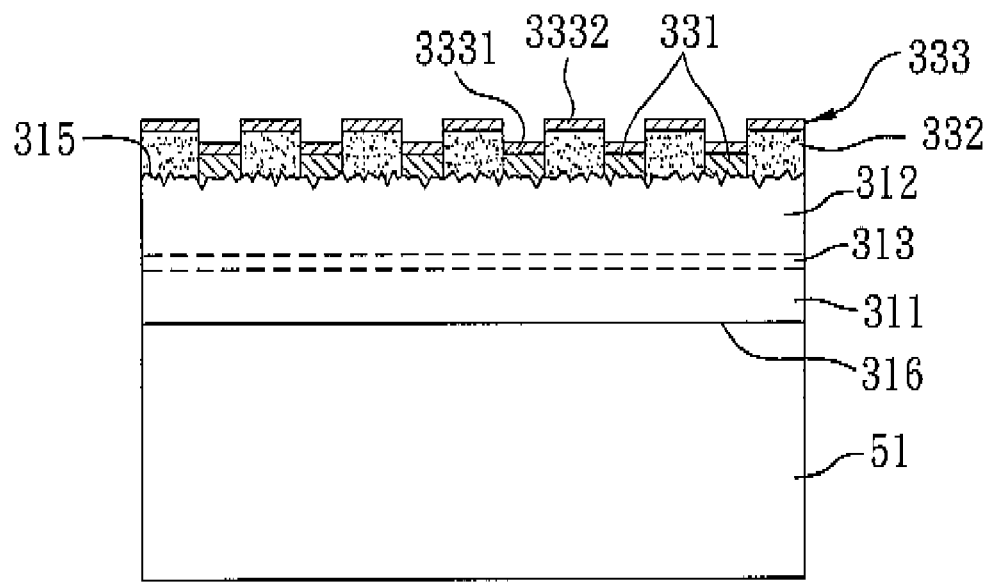
FIG. 7 is a schematic partly sectional view to illustrate a light reflecting layer that is formed on the light incident layer and the electrically conductive members according to the method of the first preferred embodiment.

Referring to FIGS. 2 and 7, in step 204, the light reflecting layer 333 is formed on the light incident layer 332 and the electrically conductive members 331. Meanwhile, in step 205, the permanent substrate 35 (see FIG. 9) is provided. In this embodiment, the light reflecting layer 333 is composed of one layer of aluminum and one layer of a gold/tin alloy.

Figure 8:
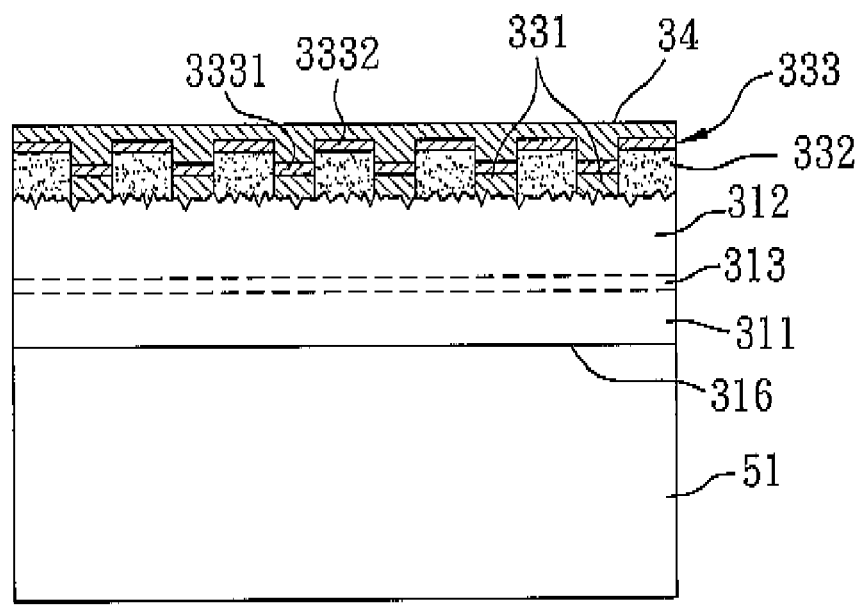
FIG. 8 is a schematic partly sectional view to illustrate an adhesive that is provided in indented parts of the light reflecting layer according to the method of the first preferred embodiment.

Referring to FIGS. 2 and 8, in step 206, the adhesive 34 in liquid form is provided on the light reflecting layer 333 during the temperature of the wafer bonding process, which normally ranges from 180° C. to 200° C. The adhesive 34 is electrically conductive and is a thermosetting adhesive that is in liquid form at a temperature ranging from 180° C. to 200° C.

Figure 9:
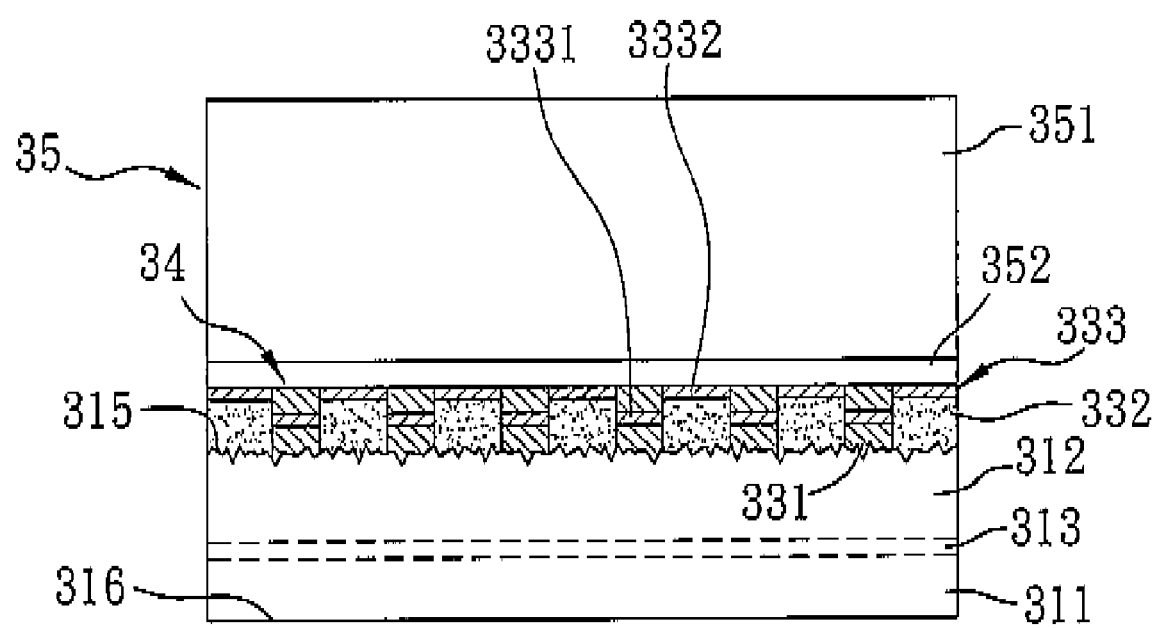
FIG. 9 is a schematic partly sectional view to illustrate a permanent substrate that is disposed on the light reflecting layer according to the method of the first preferred embodiment.

Referring to FIGS. 2 and 9, the permanent substrate 35 is provided in step 205. In step 207, the top layer 352 of the permanent substrate 35 is disposed on the light reflecting layer 333 at the temperature (180° C. to 200° C.) of the wafer bonding process. As the adhesive 34 between the top layer 352 and the light reflecting layer 333 is partially squeezed out during the wafer bonding process, the adhesive 34 is almost not left on the non-indented parts 3332 of the light reflecting layer 333. Therefore, the top layer 352 is bonded to the non-indented parts 3332 via wafer-bonding and to the indented parts 3331 via the adhesive 34. After the wafer bonding process, a cooling process is performed to achieve a room temperature. In step 208, the temporary substrate 51 is removed from the epitaxial layer 31 so that the second surface 316 of the epitaxial layer 31 is exposed.

As described above, the permanent substrate 35 which is used as the electrode is bonded to the light reflecting layer 333 by employing an adhesive bonding in addition to the wafer-bonding, thereby providing a higher bonding strength between the permanent substrate 35 and the light reflecting layer 333. Therefore, the present invention eliminates the problem of insufficient bonding and poor electrical connection encountered in the prior art in which the substrate 14 is connected to the reflective layer 12 only through wafer bonding.

In addition, the light reflecting layer 333 is not in ohmic contact with the epitaxial layer 31 according to the present invention. Because the electrically conductive members 331 are formed in ohmic contact with the epitaxial layer 31 by virtue of a high temperature process that employs a temperature higher than the temperature (180° C. to 200° C.) of the wafer bonding process before the light incident layer 332 and the reflecting layer 333 are formed, and because the high temperature process for ohmic contact is not needed when the light incident layer 332 and the light reflecting layer 333 are formed, the quality degradation problem suffered by the reflective layer 12 in the prior art due to the high temperature process can be eliminated.

The second preferred embodiment of the method according to the present invention is conducted to make the LED 3.

Figure 10:
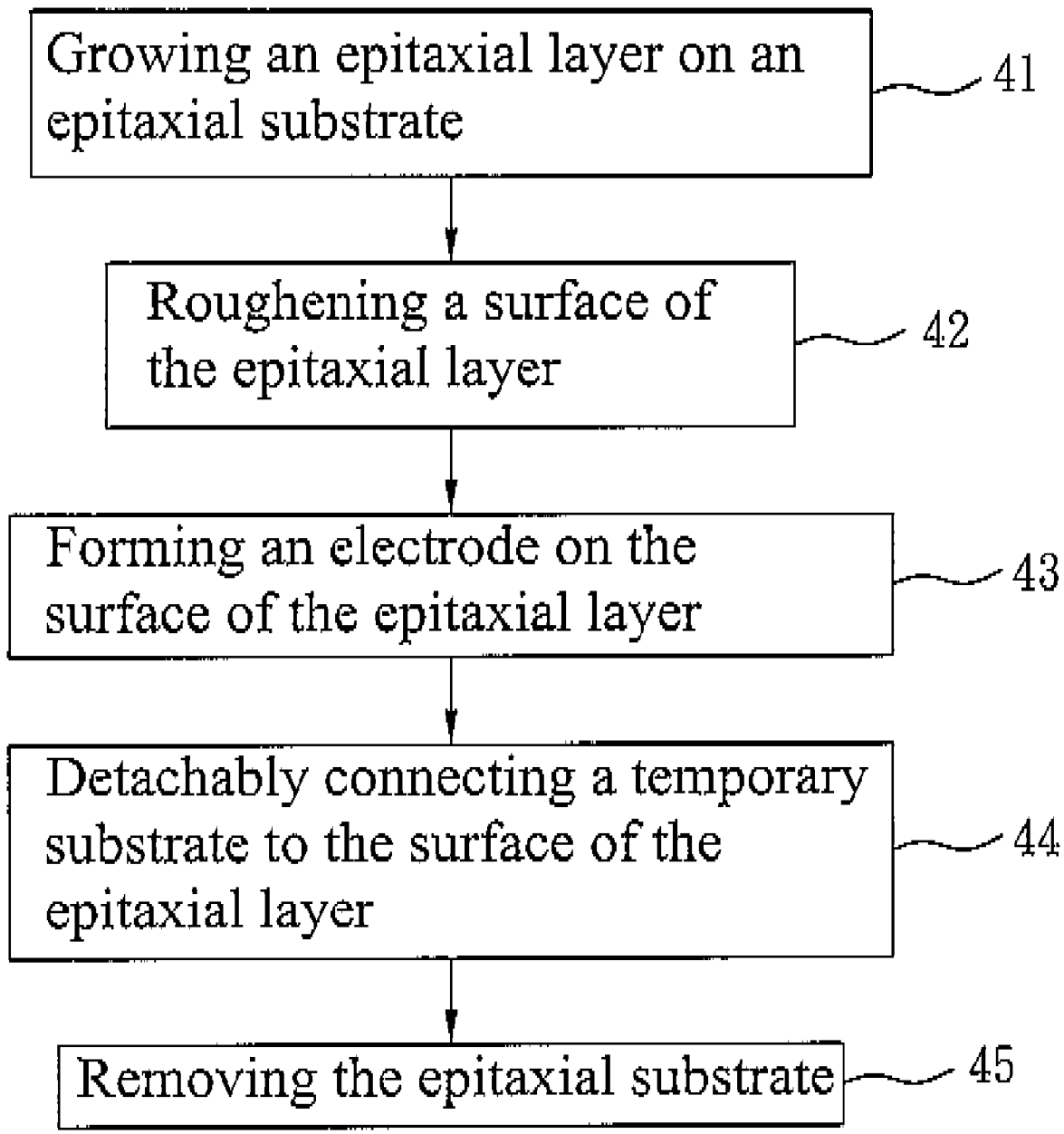
FIG. 10 is a flow chart of the second preferred embodiment of the method of making a light emitting diode according to this invention.

Referring to FIG. 10, the method of the second preferred embodiment includes steps (41 to 45) in place of step 200 (see FIG. 2) of the first preferred embodiment. Only steps 41 to 45 are shown in FIG. 10.

Figure 11:
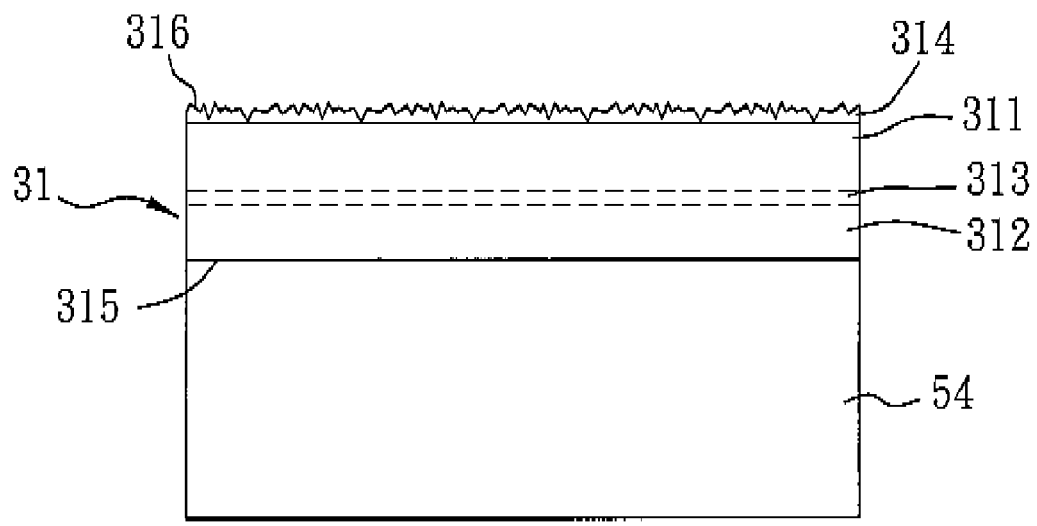
FIG. 11 is a schematic view to illustrate an epitaxial layer that is epitaxied on an epitaxial substrate according to the method of the second preferred embodiment.

Referring to FIGS. 10 and 11, in step 41, an epitaxial substrate 54, which is a sapphire substrate suitable for the gallium nitride series semiconductor material, is used so that the epitaxial layer 31 is grown on the epitaxial substrate 54. Thus, the first surface 315 of the epitaxial layer 31 is connected to the epitaxial substrate 54, and the second surface 316 of the epitaxial layer 31 is exposed. After step 41, the second surface 316 is roughened in step 42.

Figure 12:
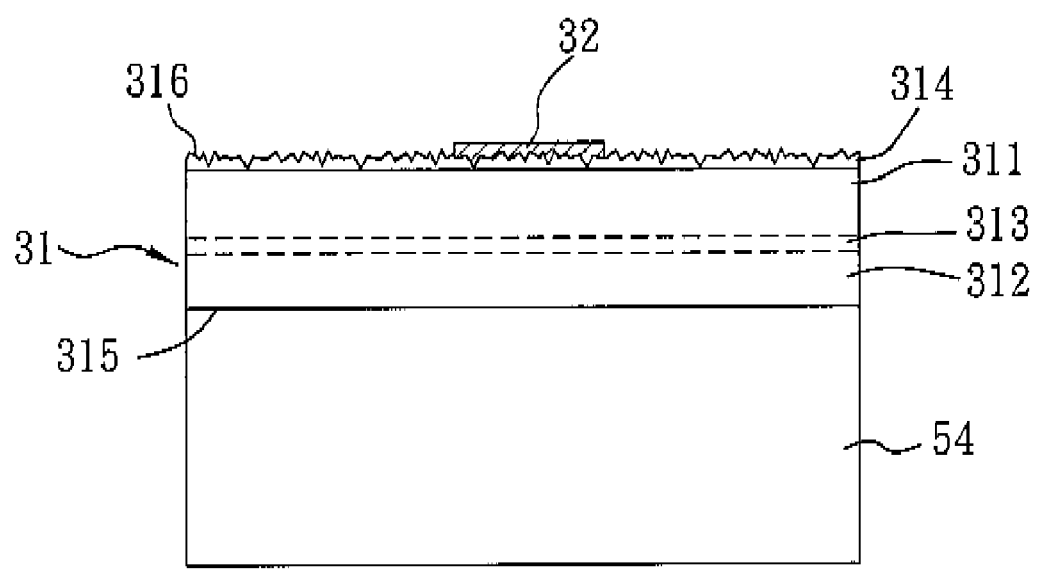
FIG. 12 is a schematic partly sectional view to illustrate an electrode that is formed on a roughened second surface of the epitaxial layer according to the method of the second preferred embodiment.

Referring to FIGS. 10 and 12, in step 43, the electrode 32 is formed in ohmic contact with the second surface 316 of the epitaxial layer 31.

Figure 13:
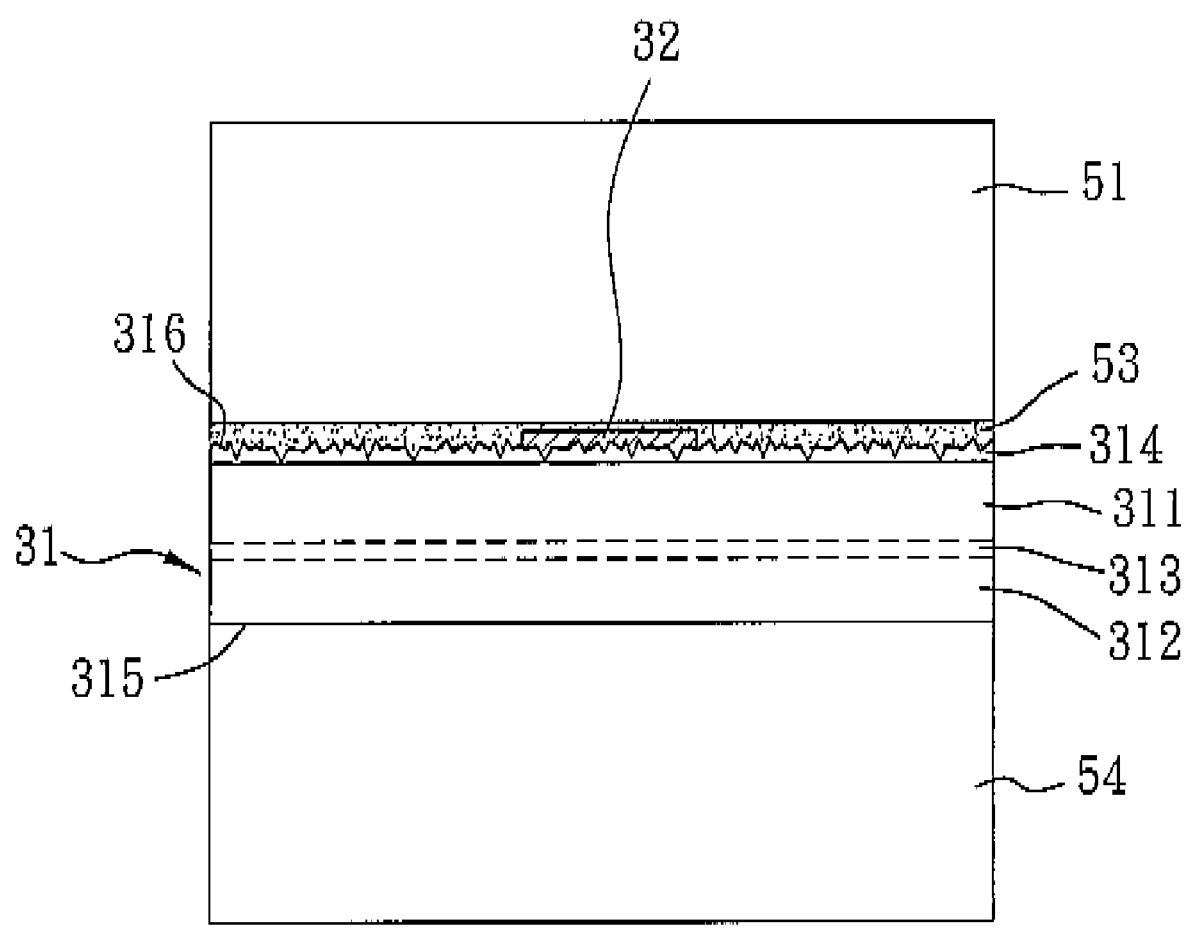
FIG. 13 is a schematic partly sectional view to illustrate a temporary substrate that is connected detachably to the roughened second surface of the epitaxial layer through wax according to the method of the second preferred embodiment.

Referring to FIGS. 10 and 13, in step 44, the temporary substrate 51 is connected detachably to the second surface 316 by disposing wax 53 between the temporary substrate 51 and the second surface 316.

Figure 14:
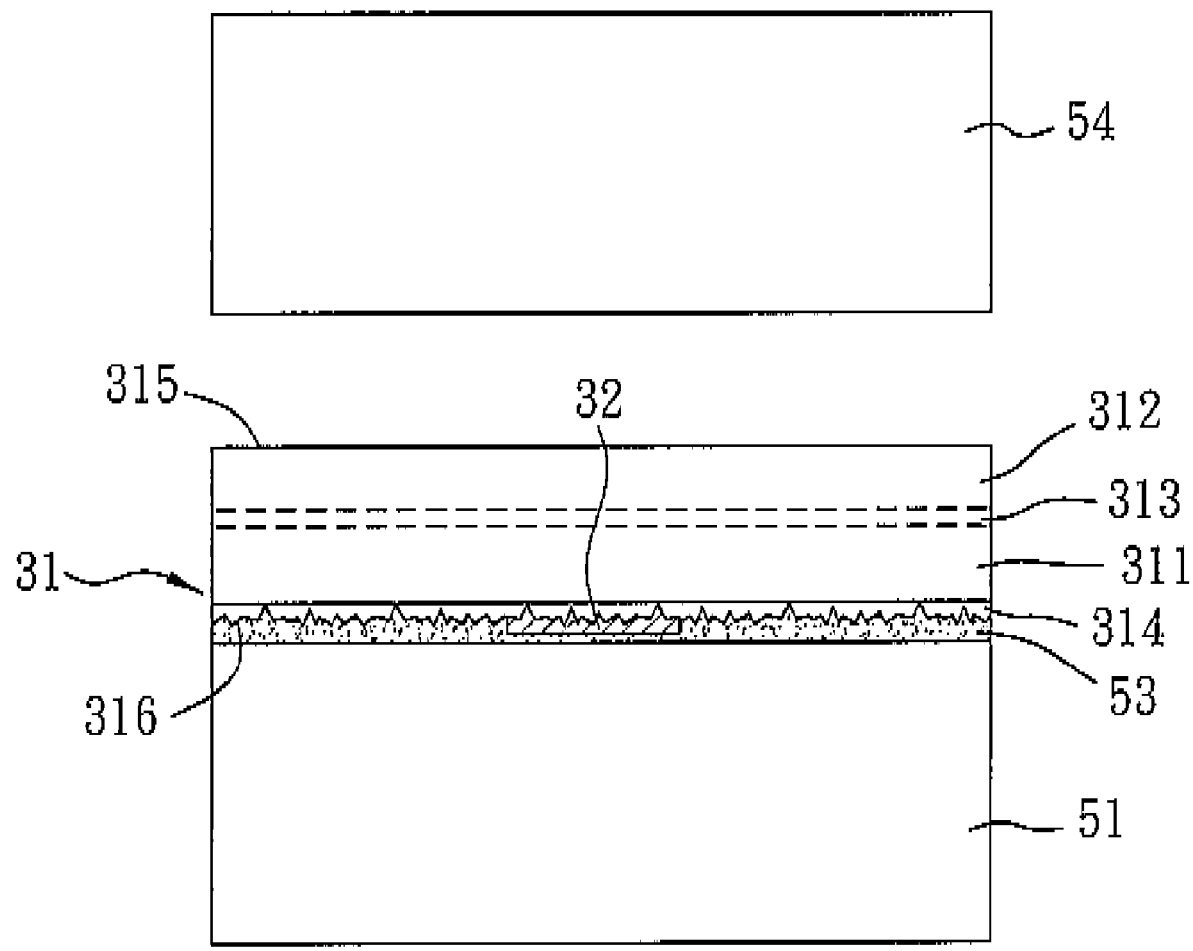
FIG. 14 is a schematic partly sectional view to illustrate the epitaxial substrate that is removed from a first surface of the epitaxial layer according to the method of the second preferred embodiment.

Referring to FIGS. 10 and 14, in step 45, the epitaxial substrate 54 is removed from the first surface 315 of the epitaxial layer 31 until the first surface 315 is exposed. Subsequently, steps 201 to 208 (see FIG. 2) are performed.

While the present invention has been described in connection with what are considered the most practical and preferred embodiments, it is understood that this invention is not limited to the disclosed embodiments but is intended to cover various arrangements included within the spirit and scope of the broadest interpretation and equivalent arrangements.

What is claimed is:

1. A method of making a light emitting diode, comprising the steps of:
   (a) forming a plurality of electrically conductive members at intervals on a first surface of an epitaxial layer which generates light so that the electrically conductive members are in ohmic contact with the epitaxial layer;
   (b) forming a light incident layer on the first surface at regions where none of the electrically conductive members are formed, the light incident layer being higher than the electrically conductive members;
   (c) forming a light reflecting layer on the light incident layer and the electrically conductive members, the light reflecting layer having indented parts where the light reflecting layer overlies the electrically conductive members, and non-indented parts where the light reflecting layer overlies the light incident layer;

(d) providing a permanent substrate;

(e) providing an adhesive in the indented parts of the light reflecting layer; and (f) disposing the permanent substrate on the light reflecting layer, and bonding the permanent substrate to the light reflecting layer, wherein the permanent substrate is bonded to the indented parts through the adhesive and to the non-indented parts through wafer-bonding.

2. The method of claim 1, further comprising, before step (a), connecting the epitaxial layer to a temporary substrate so that the temporary substrate is bonded to a second surface of the epitaxial layer opposite to the first surface, and roughening the first surface.

3. The method of claim 2, further comprising, after step (f), removing the temporary substrate from the epitaxial layer so that the second surface is exposed.

4. The method of claim 3, further comprising roughening the second surface of the epitaxial layer after the temporary substrate is removed.

5. The method of claim 4, further comprising forming an electrode in ohmic contact with the second surface of the epitaxial layer, which has been roughened.

6. The method of claim 1, wherein the adhesive is in liquid form at a temperature of a wafer bonding process.

7. The method of claim 1, wherein the light incident layer has a refractive index lower than a refractive index of the epitaxial layer.

8. The method of claim 1, wherein the epitaxial layer is made from gallium nitride.

9. The method of claim 8, further comprising, before step (a), the steps:

growing the epitaxial layer on an epitaxial substrate such that the first surface of the epitaxial layer is connected to the epitaxial substrate;

roughening a second surface of the epitaxial layer opposite to the first surface;

forming an electrode in ohmic contact with the second surface of the epitaxial layer;

detachably connecting a temporary substrate to the second surface which has been roughened;

removing the epitaxial substrate from the first surface of the epitaxial layer until the first surface is exposed; and roughening the first surface.

10. The method of claim 9, wherein the temporary substrate is connected detachably to the second surface by disposing wax between the temporary substrate and the second surface.

* * * * *